(12) United States Patent
Chen (10) Patent No.: US 12,166,155 B2
(45) Date of Patent: Dec. 10, 2024

(54) DISPLAY SUBSTRATE AND PREPARATION METHOD THEREOF, AND DISPLAY PANEL AND PREPARATION METHOD THEREOF

(71) Applicant: BOE Technology Group Co., Ltd., Beijing (CN)

(72) Inventor: Yuju Chen, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 603 days.

(21) Appl. No.: 17/414,724

(22) PCT Filed: Dec. 30, 2020

(86) PCT No.: PCT/CN2020/141471
§ 371 (c)(1),
(2) Date: Jun. 16, 2021

(87) PCT Pub. No.: WO2021/190052
PCT Pub. Date: Sep. 30, 2021

(65) Prior Publication Data
US 2022/0310877 A1    Sep. 29, 2022

(30) Foreign Application Priority Data
Mar. 24, 2020   (CN) .......................... 202010215227.3

(51) Int. Cl.
*H01L 33/38*   (2010.01)
*H01L 25/075*  (2006.01)
(Continued)

(52) U.S. Cl.
CPC ........ *H01L 33/382* (2013.01); *H01L 25/0753* (2013.01); *H01L 33/005* (2013.01);
(Continued)

(58) Field of Classification Search
CPC ..... H01L 33/382; H01L 33/005; H01L 33/40; H01L 33/486; H01L 33/505; H01L 33/62; H01L 2933/0016; H01L 2933/0066
See application file for complete search history.

(56) References Cited

U.S. PATENT DOCUMENTS

2006/0141799 A1    6/2006  Jo
2019/0302917 A1*  10/2019  Pan ..................... H01L 27/1266

FOREIGN PATENT DOCUMENTS

CN       107168589 A    9/2017
CN       109004036 A   12/2018
(Continued)

OTHER PUBLICATIONS

Translation of JP2020013954 (Year: 2020).*
PE2E Merged Document JP 2020013954A (Year: 2020).*
English Translation JP 2020013954A (Year: 2020).*

*Primary Examiner* — Mary A Wilczewski
*Assistant Examiner* — Nathan Pridemore
(74) *Attorney, Agent, or Firm* — Nath, Goldberg & Meyer; Joshua B. Goldberg (57) ABSTRACT

The present disclosure discloses a display substrate, including a substrate, and a driver circuit, an insulation layer and a bonding electrode sequentially superposed on the substrate. The bonding electrode is configured to be connected to an anode and a cathode of a micro inorganic light-emitting diode chip to be bonded. The display substrate further includes an elastic layer sandwiched between the bonding electrode and the insulation layer, the elastic layer having an orthographic projection on the substrate covering at least an orthographic projection of the bonding electrode on the substrate. The present disclosure provides a display panel, including the above display substrate, and further including a micro inorganic light-emitting diode chip having an anode (Continued)

and a cathode thereof connected to the bonding electrode on the display substrate.

13 Claims, 5 Drawing Sheets

(51) Int. Cl.
*H01L 33/00* (2010.01)
*H01L 33/40* (2010.01)
*H01L 33/48* (2010.01)
*H01L 33/50* (2010.01)
*H01L 33/62* (2010.01)

(52) U.S. Cl.
CPC ............ *H01L 33/40* (2013.01); *H01L 33/486* (2013.01); *H01L 33/505* (2013.01); *H01L 33/62* (2013.01); *H01L 2933/0016* (2013.01); *H01L 2933/0041* (2013.01); *H01L 2933/0066* (2013.01)

(56) References Cited

FOREIGN PATENT DOCUMENTS

| | | | |
|---|---|---|---|
| CN | 109148506 A | | 1/2019 |
| CN | 110190084 A | | 8/2019 |
| CN | 111508989 A | | 8/2020 |
| JP | 2020013954 A | * | 1/2020 |

* cited by examiner

Prior Art

FIG. 1

Prior Art

DISPLAY SUBSTRATE AND PREPARATION METHOD THEREOF, AND DISPLAY PANEL AND PREPARATION METHOD THEREOF

CROSS-REFERENCE TO RELATED APPLICATION

This is a National Phase Application filed under 35 U.S.C. 371 as a national stage of PCT/CN2020/141471 filed on Dec. 30, 2020, an application claiming priority to Chinese Patent Application 202010215227.3 filed with the China National Intellectual Property Administration on Mar. 24, 2020, the disclosure of which is incorporated herein by reference in its entirety.

TECHNICAL FIELD

Embodiments of the present disclosure belong to the field of display technologies, and particularly relates to a display substrate and a preparation method thereof, and a display panel and a preparation method thereof.

BACKGROUND

Micro inorganic light-emitting diode technology, also called Micro LED, refers to a high density, micro-sized LED array integrated on a chip, such as an LED display screen where each pixel can be addressed and driven individually.

The existing micro inorganic light-emitting diode technology mainly binds and connects a micro inorganic light-emitting diode chip with a driver circuit substrate by means of a mass transfer technology. The mass transfer technology is limited by the process capability, the transfer time is a major development bottleneck. The problem of the transfer time mainly lies in that the micro inorganic light-emitting diode in mass transfer is limited by the flatness of the micro inorganic light-emitting diode chip carrier board and the driver circuit substrate, and the non-uniform flatness of the micro inorganic light-emitting diode chip carrier board and the driver circuit substrate will cause great difficulty in mass transfer of the micro inorganic light-emitting diode chip.

SUMMARY

In an embodiment of the present disclosure, there is provided a display substrate and a preparation method thereof, and a display panel and a preparation method thereof.

In a first aspect, an embodiment of the present disclosure provides a display substrate, including a substrate, and a driver circuit, an insulation layer and a bonding electrode sequentially superposed on the substrate, wherein the bonding electrode is configured to be connected to an anode and a cathode of a micro inorganic light-emitting diode chip to be bonded, and the display substrate further includes an elastic layer sandwiched between the bonding electrode and the insulation layer, the elastic layer having an orthographic projection on the substrate covering at least an orthographic projection of the bonding electrode on the substrate.

In some embodiments, a material of the elastic layer includes any one of photoresist, natural rubber, and PDMS.

In some embodiments, a material of the elastic layer includes a conductive photoresist.

In some embodiments, the elastic layer has a minimum film thickness of: [(pressure/stress)]/elastic modulus*[(X1/L1−X2/L2)L1];

where the pressure refers to a pressure at which a transfer carrier board carrying the micro inorganic light-emitting diode chip to be bonded is bonded and pressed on the display substrate; the stress refers to an internal stress of the display substrate; the elastic modulus refers to an elastic modulus of the elastic layer; $X1$ is a distance between a position point of maximum warping of the transfer carrier board carrying the micro inorganic light-emitting diode chip to be bonded and the position point when no warping occurs; $L1$ is a width of the transfer carrier board carrying the micro inorganic light-emitting diode chip to be bonded that is perpendicular to a warping direction thereof; $X2$ is a distance between a position point of maximum warping of the display substrate and the position point when no warping occurs; and $L2$ is a width of the display substrate that is perpendicular to a warping direction thereof.

In some embodiments, the bonding electrode includes a first electrode and a second electrode spaced apart from each other, the orthographic projection of the elastic layer on the substrate covers an orthographic projection of the first electrode on the substrate, as well as an orthographic projection of the second electrode on the substrate and a spacer region between the orthogonal projections of the first electrode and the second electrode on the substrate.

In some embodiments, a first connection line and a second connection line are further included; wherein the insulation layer is opened with a first via and a second via, the first connection line connects the first electrode and a first end of the driver circuit through the first via; and the second connection line connects the second electrode and a second end of the driver circuit through the second via.

In some embodiments, the bonding electrode includes a first electrode and a second electrode spaced apart from each other, the elastic layer includes a first subsection and a second subsection spaced apart from each other, an orthographic projection of the first subsection on the substrate covers an orthographic projection of the first electrode on the substrate, and an orthographic projection of the second subsection on the substrate covers an orthographic projection of the second electrode on the substrate.

In some embodiments, the insulation layer is opened with a first via and a second via, the first subsection extends through the first via to be connected to a first end of the driver circuit; and the second subsection extends through the second via to be connected to a second end of the driver circuit.

In some embodiments, a material of the first electrode includes any one or more of titanium, nickel, copper and gold; and a material of the second electrode includes any one or more of titanium, nickel, copper and gold.

In a second aspect, an embodiment of the present disclosure provides a display panel, including the display substrate as described above, and further including a micro inorganic light-emitting diode chip having an anode and a cathode thereof connected to the bonding electrode on the display substrate.

In some embodiments, there are a plurality of micro inorganic light-emitting diode chips arranged in an array; the micro inorganic light-emitting diode chips emit light of the same color; and the display panel further includes a light conversion layer provided on a side of the micro inorganic light-emitting diode chips facing away from the display substrate, wherein the light conversion layer is distributed corresponding to the micro inorganic light-emitting diode chip.

In some embodiments, the display substrate has a first sub-pixel region, a second sub-pixel region and a third sub-pixel region adjacent to and spaced from each other; the first sub-pixel region, the second sub-pixel region and the third sub-pixel region are respectively provided with one micro inorganic light-emitting diode chip;

the light conversion layer includes a red quantum dot pattern, a green quantum dot pattern and a transparent adhesive film pattern;

the red quantum dot pattern is provided on a light-emitting side of the micro inorganic light-emitting diode chip in the first sub-pixel region, the green quantum dot pattern is provided on a light-emitting side of the micro inorganic light-emitting diode chip in the second sub-pixel region, and the transparent adhesive film pattern is provided on a light-emitting side of the micro inorganic light-emitting diode chip in the third sub-pixel region.

In some embodiments, an opaque pixel defining layer is disposed between the first, second and third sub-pixel regions.

In some embodiments, the insulation layer in the display substrate is opaque to light.

In a third aspect, an embodiment of the present disclosure provides a preparation method of a display substrate, including sequentially preparing a driver circuit, an insulation layer and a bonding electrode on a substrate, wherein the bonding electrode is configured to be connected to an anode and a cathode of a micro inorganic light-emitting diode chip to be bonded, and the preparation method further includes, after preparing the insulation layer and before the bonding electrode, preparing an elastic layer which has an orthographic projection on the substrate covering at least an orthographic projection of the bonding electrode on the substrate.

In some embodiments, preparing the elastic layer includes:

calculating a minimum film thickness of the elastic layer, and determining a minimum process film thickness of the elastic layer according to the minimum film thickness;

coating to form an elastic layer film with the minimum process film thickness;

exposing and developing to form a pattern of the elastic layer; and drying and curing the elastic layer.

In a fourth aspect, an embodiment of the present disclosure provides a preparation method of a display panel, including bonding and connecting the display substrate prepared according to the above method to a micro inorganic light-emitting diode chip, wherein an anode and a cathode of the micro inorganic light-emitting diode chip are connected to the bonding electrode on the display substrate.

In some embodiments, there are a plurality of micro inorganic light-emitting diode chips arranged in an array; the micro inorganic light-emitting diode chips emit light of the same color; and the preparation method of a display panel further includes preparing a light conversion layer; wherein the light conversion layer is prepared on a side of the micro inorganic light-emitting diode chips facing away from the display substrate, and the light conversion layer is distributed corresponding to the micro inorganic light-emitting diode chip.

In some embodiments, the display substrate has a first sub-pixel region, a second sub-pixel region and a third sub-pixel region adjacent to and spaced from each other; the first sub-pixel region, the second sub-pixel region and the third sub-pixel region are respectively provided with one micro inorganic light-emitting diode chip;

preparing the light conversion layer includes preparing a red quantum dot pattern, a green quantum dot pattern and a transparent adhesive film pattern; and the preparation method further includes forming a red quantum dot pattern on a light-emitting side of the micro inorganic light-emitting diode chip in the first sub-pixel region; forming a green quantum dot pattern on a light-emitting side of the micro inorganic light-emitting diode chip in the second sub-pixel region; and forming a transparent adhesive film pattern on a light-emitting side of the micro inorganic light-emitting diode chip in the third sub-pixel region.

In some embodiments, the preparation method further includes forming an opaque pixel defining layer between the first, second and third sub-pixel regions.

BRIEF DESCRIPTION OF THE DRAWINGS

Accompanying drawings are provided for further understanding of the embodiments of the disclosure and constitute a part of the specification. Hereinafter, these drawings are intended to explain the disclosure together with the following embodiments, but should not be considered as a limitation to the disclosure. The above and other features and advantages will become more apparent to those skilled in the art through detailed description of the exemplary embodiments with reference to the accompanying drawings, in which.

REFERENCE SIGNS

1. substrate; 2. driver circuit; 3. insulation layer; 31. first via; 32. second via; 4. elastic layer; 41. first subsection; 42. second subsection; 5. transfer carrier board; 61. first sub-pixel region; 62. second sub-pixel region; 63. third sub-pixel region; 7. first electrode; 8. second electrode; 9. first connection line; 10. second connection line; 11. micro inorganic light-emitting diode chip; 111. anode; 112. cathode; 13. red quantum dot pattern; 14. green quantum dot pattern; 15. transparent adhesive film pattern; 16. pixel defining layer; 17. driver circuit substrate; and 18. wafer substrate.

DETAILED DESCRIPTION OF THE EMBODIMENTS

In order to make those skilled in the art better understand the technical solutions in the embodiments of the present disclosure, the display substrate and the preparation method thereof, and the display panel and the preparation method thereof provided in the embodiments of the present disclosure will be described in further detail below with reference to the accompanying drawings and specific embodiments.

Embodiments of the present disclosure will be described more sufficiently below with reference to the accompanying drawings, but which may be embodied in different forms and should not be construed as limited to the embodiments set forth in the disclosure. Rather, these embodiments are provided so that this disclosure will be thorough and complete, and will fully convey the scope of the disclosure to those skilled in the art.

The embodiments of the present disclosure are not limited to the embodiments shown in the drawings, but include modifications of configurations formed based on a manufacturing process. Thus, the regions illustrated in the figures have schematic properties, and the shapes of the regions shown in the figures exemplarily illustrate specific shapes of the regions, but are not intended to be limiting.

Figure 1:
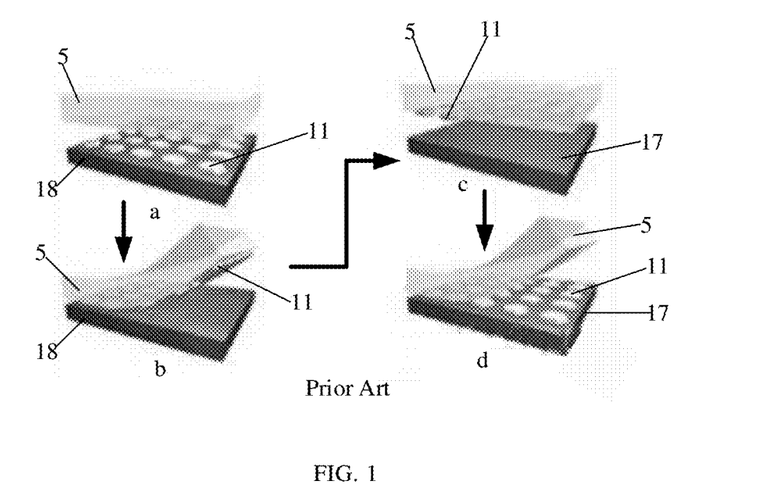
FIG. 1 is a schematic diagram showing a process for mass transfer bonding of a micro inorganic light-emitting diode chip.

In the related art, as shown in FIG. 1, a) a transfer carrier board 5 is disposed on a side of a wafer substrate 18 having a micro inorganic light-emitting diode chip 11; b) the micro inorganic light-emitting diode chip 11 is transferred from the wafer substrate 18 to the transfer carrier board 5; c) the transfer carrier board 5 with the micro inorganic light-emitting diode chip 11 is placed on a side of a driver circuit substrate 17; d) the micro inorganic light-emitting diode chip 11 is aligned and pressed on the driver circuit substrate 17 through an alignment and pressing device and process so that the anode and the cathode of the micro inorganic light-emitting diode chip 11 are respectively in press-fit welding or bonding solidification with the corresponding bonding electrode on the driver circuit substrate 17, and then the transfer carrier board 5 is peeled off.

During the mass transfer process of the micro inorganic light-emitting diode chip, limited by the flatness of the micro inorganic light-emitting diode chip transfer carrier board and the driver circuit substrate, the micro inorganic light-emitting diode chip transfer carrier board and the driver circuit substrate are warped in different positions to different degrees, leading to non-uniform flatness of the micro inorganic light-emitting diode chip transfer carrier board and the driver circuit substrate, which brings great difficulty in the mass transfer of the micro inorganic light-emitting diode chip.

Figure 2:
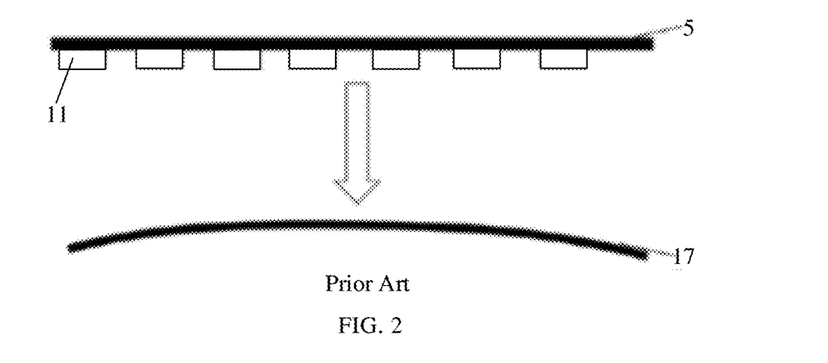
FIG. 2 is a schematic diagram showing a driver circuit substrate with warping.

Generally, surface layers of a low temperature polysilicon driver circuit substrate and an oxide driver circuit substrate need to be subjected to insulation passivation treatment, wherein the passivation film usually has a multi-layer film structure, and, limited by the non-uniformity of the device manufacturing process, the entire driver circuit substrate 17 may be warped toward a side of the micro inorganic light-emitting diode chip to be bonded, as shown in FIG. 2, resulting in non-uniform flatness of the driver circuit substrate, which brings great difficulty in the mass transfer.

In order to solve the problems of difficulty in mass transfer and low efficiency of the micro inorganic light-emitting diode chip caused by non-uniform flatness of the micro inorganic light-emitting diode chip carrier board and the driver circuit substrate, embodiments of the present disclosure provide a display substrate and a preparation method thereof, and a display panel and a preparation method thereof.

Figure 3:
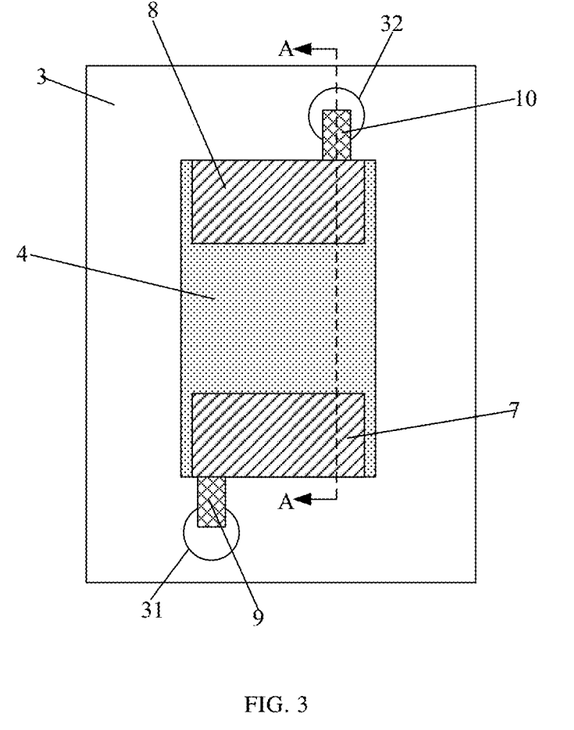
FIG. 3 is a partial structure top view of a display substrate according to an embodiment of the disclosure.
Figure 4:
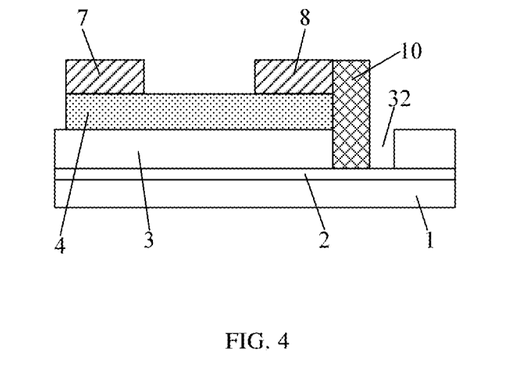
FIG. 4 is a partial structure cross-sectional view of the display substrate shown in FIG. 3 taken along line AA.

In an embodiment of the present disclosure, there is provided a display substrate which, as shown in FIGS. 3 and 4, includes a substrate 1, and a driver circuit 2, an insulation layer 3 and a bonding electrode sequentially superposed on the substrate 1. The bonding electrode is configured to be connected to an anode and a cathode of a micro inorganic light-emitting diode chip to be bonded. The display substrate further includes an elastic layer 4 sandwiched between the bonding electrode and the insulation layer 3, and having an orthographic projection on the substrate 1 covering at least an orthographic projection of the bonding electrode on the substrate 1.

Figure 5:
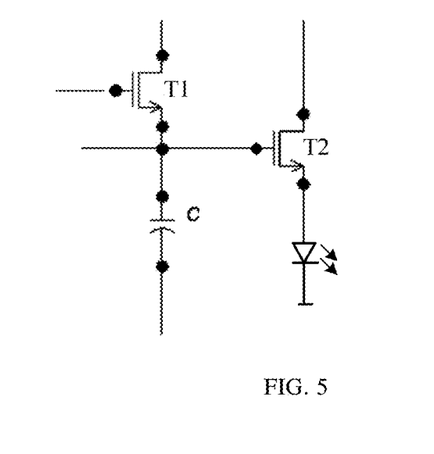
FIG. 5 is a circuit diagram of a 2T1C driver circuit in an embodiment of the present disclosure.

The driver circuit 2 disposed on the substrate includes components such as a thin film transistor, for example, a driver circuit such as 2T1C (shown in FIG. 5) or 3T1C. The transistor in the driver circuit 2 may be a low temperature polysilicon transistor (LTPS TFT) or an indium gallium zinc oxide transistor (IGZO TFT). The insulation layer 3 may have a single-layer structure or a multilayer structure; and the insulation layer 3 is made of an inorganic insulating material, such as silicon oxide, silicon nitride, etc., which can prevent water and oxygen from invading the driver circuit 2, and causing oxidation damage to the electrical components in the driver circuit 2. In some embodiments, the insulation layers 3 may have a thickness of about 300 nm.

The elastic layer 4 has certain elasticity and flexibility performance. For example, the elastic layer 4 usually has an elastic modulus within the range of 2.0 MPa to 10 MPa. By providing the elastic layer 4 between the bonding electrode and the insulation layer 3, and that the orthographic projection of the elastic layer 4 on the substrate 1 covers at least the orthographic projection of the bonding electrode on the substrate 1, the aligning and bonding pressure between the bonding electrode and the anode and the cathode electrodes of the micro inorganic light-emitting diode chip can be compensated and buffered during the bonding process of the mass transferred micro inorganic light-emitting diode chip and the display substrate, and the bonding difficulty between the anode and the cathode of the micro inorganic light-emitting diode chip and the bonding electrode on the display substrate caused by non-uniform flatness of the display substrate and the transfer carrier board of the micro inorganic light-emitting diode chip can be reduced, so that the mass transfer of the micro inorganic light-emitting diode chip can realize the bonding of the micro inorganic light-emitting diode chip with the same precision without reducing a transfer area of the transfer carrier board, while the mass transfer time is shortened and the mass transfer efficiency is improved.

In some embodiments, a material of the elastic layer 4 includes any one of photoresist, natural rubber, and PDMS.

Figure 6:
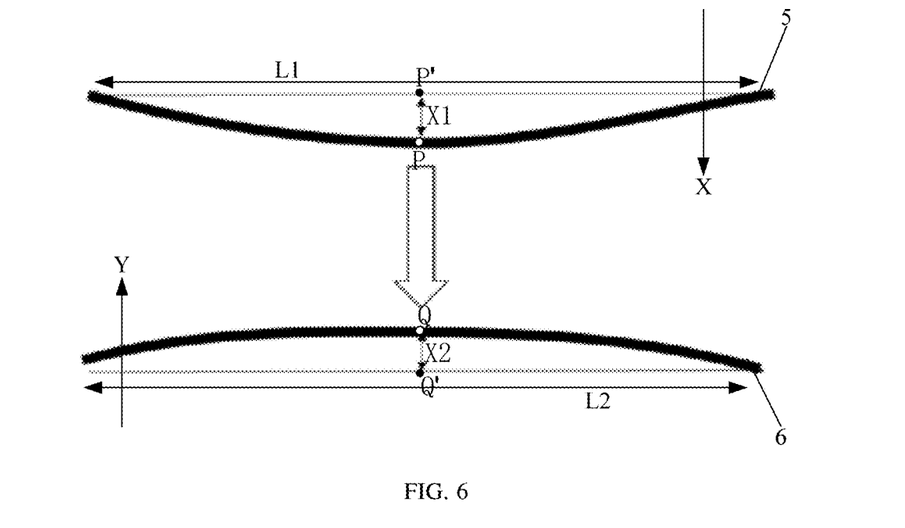
FIG. 6 is a side view of a warped transfer carrier board and a warped display substrate.

In some embodiments, the elastic layer 4 has a minimum film thickness of: $[(\text{pressure}/\text{stress})]/\text{elastic modulus} * [(X1/L1 - X2/L2)L1]$; where, as shown in FIG. 6, the pressure refers to a pressure at which a transfer carrier board 5 carrying the micro inorganic light-emitting diode chip to be bonded is bonded and pressed on the display substrate 6; the stress refers to an internal stress of the display substrate 6; the elastic modulus refers to an elastic modulus of the elastic layer 4; X1 is a distance between a position point P of maximum warping of the transfer carrier board 5 carrying the micro inorganic light-emitting diode chip to be bonded and the position point P' when no warping occurs; L1 is a width of the transfer carrier board 5 carrying the micro inorganic light-emitting diode chip to be bonded that is perpendicular to a warping direction X thereof; X2 is a distance between a position point Q of maximum warping of the display substrate 6 and the position point Q' when no warping occurs; and L2 is a width of the display substrate 6 is perpendicular to a warping direction Y thereof.

In some embodiments, the bonding electrode includes a first electrode 7 and a second electrode 8 spaced apart from each other, and the orthographic projection of the elastic layer 4 on the substrate 1 covers an orthographic projection of the first electrode 7 on the substrate 1, as well as an orthographic projection of the second electrode 8 on the substrate 1 and a spacer region between the orthogonal projections of the first electrode 7 and the second electrode 8 on the substrate 1. With such arrangement, the aligning and bonding pressure between the bonding electrode and the anode and the cathode electrodes of the micro inorganic light-emitting diode chip can be better compensated and buffered, and the bonding difficulty between the anode and the cathode of the micro inorganic light-emitting diode chip and the bonding electrode on the display substrate caused by non-uniform flatness of the display substrate and the transfer carrier board of the micro inorganic light-emitting diode chip can be reduced.

In this embodiment, the display substrate further includes a first connection line 9 and a second connection line 10; wherein the insulation layer 3 is opened with a first via 31 and a second via 32, the first connection line 9 connects the first electrode 7 and a first end of the driver circuit 2 through the first via 31; and the second connection line 10 connects the second electrode 8 and a second end of the driver circuit 2 through the second via 32. The first end and the second end of the driver circuit 2 refer to two electrode ends of the driver circuit 2 that are configured to be respectively connected to the anode and the cathode of the micro inorganic light-emitting diode chip, and configured to provide driving voltage for the micro inorganic light-emitting diode chip.

In this embodiment, a material of the first electrode 7 includes any one or more of titanium, nickel, copper and gold; and a material of the second electrode 8 includes any one or more of titanium, nickel, copper and gold. The first electrode 7 may have a single-layer structure made of a certain metal material. For example, the first electrode 7 is a single-layer structure made of any metal material selected from titanium, nickel, copper, and gold. Alternatively, the first electrode 7 may have a laminated structure consisting of several different metal material layers. For example, the first electrode 7 is a stack structure of Ti/Ni/Au or a stack structure of Ti/Ni/Cu. Likewise, the second electrode 8 may have a single-layer structure made of a certain metal material. For example, the second electrode 8 is a single-layer structure made of any metal material selected from titanium, nickel, copper, and gold. Alternatively, the second electrode 8 may have a laminated structure consisting of several different metal material layers. For example, the second electrode 8 is a stack structure of Ti/Ni/Au or a stack structure of Ti/Ni/Cu.

Based on the above structure of the display substrate, in an embodiment of the present disclosure, there is further provided a preparation method of a display substrate, including sequentially preparing a driver circuit, an insulation layer and a bonding electrode on a substrate, wherein the bonding electrode is configured to be connected to an anode and a cathode of a micro inorganic light-emitting diode chip to be bonded, and the preparation method further includes, after preparing the insulation layer and before the bonding electrode, preparing an elastic layer which has an orthographic projection on the substrate covering at least an orthographic projection of the bonding electrode on the substrate.

Preparing the elastic layer includes the following steps S01 to S04.

At S01: calculating a minimum film thickness of the elastic layer, and determining a minimum process film thickness of the elastic layer according to the minimum film thickness.

In this step, the warping of the transfer carrier board and the warping of the display substrate are measured to obtain X1, L1, X2, and L2; the pressure at which a transfer carrier board carrying the micro inorganic light-emitting diode chip to be bonded is bonded and pressed on the display substrate may be preset in advance; the internal stress of the display substrate may be obtained by calculation from a warping degree of the display substrate; and the elastic modulus is obtained depending on the material used for the elastic layer. The minimum film thickness of the elastic layer may be calculated from the formula $[(pressure/stress)]/elastic\ modulus*[(X1/L1-X2/L2)L1]$. For example, after measurement, it is obtained that X1=2 μm; X2=15 μm; L1=10 mm; and L2=101.6 mm; the elastic layer uses a SU8-3000 type photoresist, having an elastic modulus of 2.0 MPa; the expected bonding pressure is 2 Mpa; and the internal stress of the display substrate is 1 Mpa. The minimum film thickness of the elastic layer is calculated as $[(2\ MPa/1\ MPa)]/2*[(2/10000-15/101600)*10000]$ =0.052 μm; thereby, it can be determined that the minimum process film thickness of the elastic layer is 1-2 μm.

At S02: coating to form an elastic layer film with the minimum process film thickness.

In this step, an elastic layer film having a thickness of 2 μm may be formed by spin coating the SU8-3000 type photoresist at a speed of 4000 rpm.

At S03: exposing and developing to form a pattern of the elastic layer.

At S04: drying and curing the elastic layer.

In this step, the elastic layer is dried and cured, for example, at a temperature of 200V.

In addition, in the preparation method of the display substrate in this embodiment, the driver circuit, the insulation layer, and the bonding electrode are all prepared by conventional patterning processes, which are not described in detail here.

In another embodiment the present disclosure, there is provided a display substrate, which differs from the display substrate in the above embodiments in that the material of the elastic layer includes a conductive photoresist. For example, nanometer silver powder and carbon powder are mixed into the photoresist to form a conductive photoresist.

Figure 7:
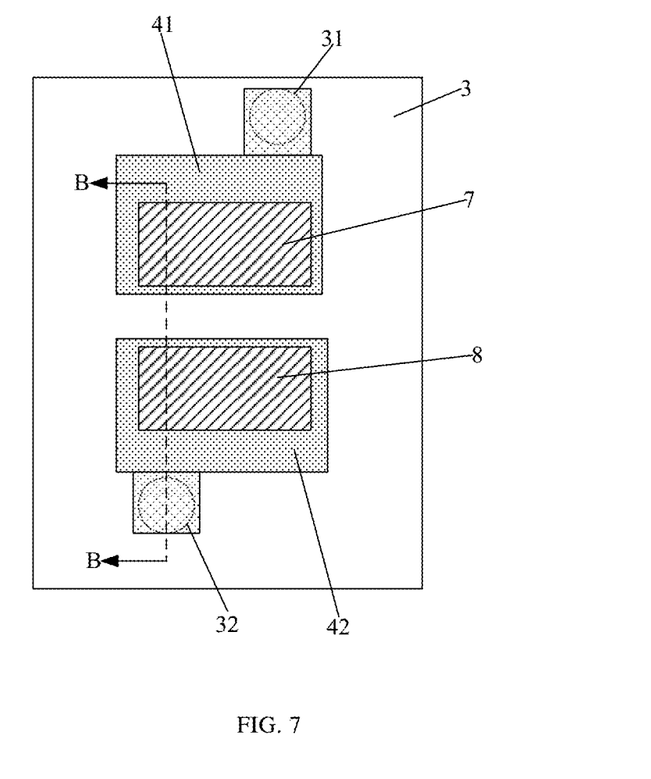
FIG. 7 is a partial structure top view of another display substrate according to an embodiment of the disclosure.
Figure 8:
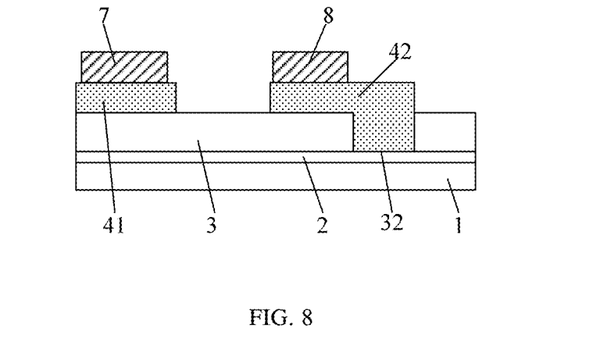
FIG. 8 is a partial structure cross-sectional view of the display substrate shown in FIG. 7 taken along line BB.

In some embodiments, as shown in FIGS. 7 and 8, the bonding electrode includes a first electrode 7 and a second electrode 8 spaced apart from each other, and when the material of the elastic layer includes a conductive photoresist, the elastic layer includes a first subsection 41 and a second subsection 42 spaced apart from each other, an orthographic projection of the first subsection 41 on the substrate 1 covers an orthographic projection of the first electrode 7 on the substrate 1, and an orthographic projection of the second subsection 42 on the substrate 1 covers an orthographic projection of the second electrode 8 on the substrate 1. Since the elastic layer adopts a conductive material, the first subsection 41 and the second subsection 42 of the elastic layer respectively disposed below the first electrode 7 and the second electrode 8 are spaced apart and insulated from each other.

By making the orthographic projection of the first subsection 41 on the substrate 1 cover the orthographic projection of the first electrode 7 on the substrate 1, and making the orthographic projection of the second subsection 42 on the substrate 1 cover the orthographic projection of the second electrode 8 on the substrate 1, the aligning and bonding pressure between the bonding electrode and the anode and the cathode electrodes of the micro inorganic light-emitting diode chip can be better compensated and buffered, and the bonding difficulty between the anode and the cathode of the micro inorganic light-emitting diode chip and the bonding electrode on the display substrate caused by non-uniform flatness of the display substrate and the transfer carrier board of the micro inorganic light-emitting diode chip can be reduced.

In this embodiment, the insulation layer 3 is opened with a first via 31 and a second via 32, the first subsection 41 extends through the first via 31 to be connected to a first end of the driver circuit 2; and the second subsection 42 extends through the second via 32 to be connected to a second end of the driver circuit 2. The first end and the second end of the driver circuit 2 refer to two electrode ends of the driver circuit 2 that are configured to be respectively connected to the anode and the cathode of the micro inorganic light-emitting diode chip, and configured to provide driving voltage for the micro inorganic light-emitting diode chip.

Other structures of the display substrate in this embodiment are the same as those in the above embodiments, and thus are not repeated here.

Based on the structure of the display substrate in this embodiment, an embodiment of the present disclosure further provides a preparation method of a display substrate, which differs from the preparation method of the display substrate in the above embodiments merely in the material of the elastic layer, and thus is not repeated here.

In the display substrate provided in the above embodiments of the present disclosure, since the elastic layer has certain elasticity and flexibility performance, by providing the elastic layer between the bonding electrode and the insulation layer and having an orthographic projection on the substrate covering at least an orthographic projection of the bonding electrode on the substrate, the aligning and bonding pressure between the bonding electrode and the anode and the cathode electrodes of the micro inorganic light-emitting diode chip can be compensated and buffered during the bonding process of the micro inorganic light-emitting diode chip and the display substrate, and the bonding difficulty between the anode and the cathode of the micro inorganic light-emitting diode chip and the bonding electrode on the display substrate caused by non-uniform flatness of the display substrate and the transfer carrier board of the micro inorganic light-emitting diode chip can be reduced, so that the mass transfer of the micro inorganic light-emitting diode chip can realize the bonding of the micro inorganic light-emitting diode chip with the same precision without reducing a transfer area of the transfer carrier board, while the mass transfer time is shortened and the mass transfer efficiency is improved.

Figure 9:
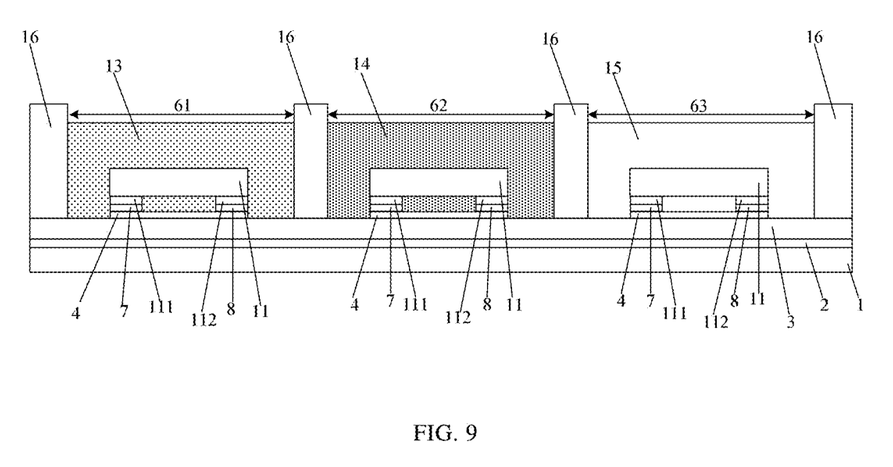
FIG. 9 is a partial structure cross-sectional view of a display panel according to an embodiment of the disclosure.

In another embodiment the present disclosure, there is provided a display panel which, as shown in FIG. 9, includes the display substrate of any of the above embodiments, and further includes a micro inorganic light-emitting diode chip 11 having an anode 111 and a cathode 112 thereof connected to the bonding electrode on the display substrate.

In some embodiments, there are a plurality of micro inorganic light-emitting diode chips 11 arranged in an array; the micro inorganic light-emitting diode chips 11 emit light of the same color; and the display panel further includes a light conversion layer provided on a side of the micro inorganic light-emitting diode chip 11 facing away from the display substrate, wherein the light conversion layer is distributed corresponding to the micro inorganic light-emitting diode chip 11.

In some embodiments, the display substrate has a first sub-pixel region 61, a second sub-pixel region 62 and a third sub-pixel region 63 adjacent to and spaced from each other; the first sub-pixel region 61, the second sub-pixel region 62 and the third sub-pixel region 63 are respectively provided with one micro inorganic light-emitting diode chip 11; the light conversion layer includes a red quantum dot pattern 13, a green quantum dot pattern 14 and a transparent adhesive film pattern 15; the red quantum dot pattern 13 is provided on a light-emitting side of the micro inorganic light-emitting diode chip 11 in the first sub-pixel region 61, the green quantum dot pattern 14 is provided on a light-emitting side of the micro inorganic light-emitting diode chip 11 in the second sub-pixel region 62, and the transparent adhesive film pattern 15 is provided on a light-emitting side of the micro inorganic light-emitting diode chip 11 in the third sub-pixel region 63.

In some embodiments, the red quantum dot pattern 13 has a thickness in the range of 10 to 50 μm; the green quantum dot pattern 14 has a thickness in the range of 15 to 50 μm; and the transparent adhesive film pattern 15 has a thickness in the range of 5 to 50 μm.

The current RGB LED display panel is easily affected by the bin distribution of the LEDs (i.e. the LEDs produced under the same production condition have chromatic aberration), resulting in poor color purity. In this embodiment, the micro inorganic light-emitting diode chip 11 emits blue light, the red quantum dot pattern 13 and the green quantum dot pattern 14 reach an excited state after being irradiated by the blue light emitted from the micro inorganic light-emitting diode chip 11, thereby emitting red light and green light, respectively, and the red quantum dot pattern 13 and the green quantum dot pattern 14 enable the quantum dots to reach a wider spectral range of the excited state so that the quantum dots can be excited as long as the excitation light energy is higher than a threshold, and regardless of the wavelength of the excitation light are, emission spectra of the quantum dots of fixed material and size are fixed, and the emission spectral range is relatively narrow and symmetrical. In addition, the amount of light emitted from the blue light micro inorganic light-emitting diode chip 11 can be controlled by the driver circuit on the display substrate so that the red quantum dot pattern 13 and the green quantum dot pattern 14 are controlled to be photo-excited to form grayscale. For the micro inorganic light-emitting diode chip 11 emitting blue light, since the emission spectral range thereof is narrow and the chromatic aberration of the blue light micro inorganic light-emitting diode chip 11 is not obvious, only the transparent adhesive film pattern 15 is required to be provided on the light-emitting side of the micro inorganic light-emitting diode chip 11 in the third sub-pixel region 63. Therefore, by providing the red quantum dot pattern 13 and the green quantum dot pattern 14, not only color display of the LED display panel is realized, but also the display effect of the display panel is improved.

In some embodiments, an opaque pixel defining layer 16 is disposed between the first sub-pixel region 61, the second sub-pixel region 62 and the third sub-pixel region 63. The pixel defining layer 16 is made of, for example, a white opaque polyimide material, and may even be made of a material that reflects light. It will be appreciated that a height of the pixel defining layer 16 may be equal to or slightly greater than a thickness of the light conversion layer in a direction perpendicular to the substrate. By providing the pixel defining layer 16, color crosstalk between adjacent micro inorganic light-emitting diode chips 11 can be prevented, and the display effect can be improved.

In this embodiment, the anode 111 and the cathode 112 of the micro inorganic light-emitting diode chip 11 are made of nickel, gold, copper, or other materials, and the anode 111 and the cathode 112 are usually provided with a metal pad configured to enhance the bonding connection between the anode 111 and the cathode 112 with the bonding electrode, and reduce the contact resistance, and thus improve the lighting effect of the micro inorganic light-emitting diode chip 11. The metal pad is usually made of nickel, gold, copper or other materials. Alternatively, the anode and cathode of the micro inorganic light-emitting diode chip 11 may be made of a transparent indium tin oxide (ITO) material, but the adhesion of a metal pad on the ITO layer is insufficient, so the ITO layer needs to be covered with a zinc oxide layer, and then the metal pad is provided on the zinc oxide layer. The zinc oxide layer can enhance the adhesion between the transparent ITO layer and the metal pad so that the micro inorganic light-emitting diode chip 11 has better conductivity.

In some embodiments, the insulation layer in the display substrate is opaque to light. In this manner, one-sided light emission of the display panel is realized.

It should be noted that to realize one-sided light emission of the display panel, the elastic layer 4 in the display substrate may be set to be opaque, or a light shielding layer may be separately provided on the display substrate.

In addition, the display substrate may be a light-transmitting substrate so that double-sided light emission of the display panel is realized. The specific display mode of the display panel is not limited herein.

Based on the above structure of the display panel, another embodiment the present disclosure provides a preparation method of a display panel, including bonding and connecting the display substrate prepared according to the above embodiments to a micro inorganic light-emitting diode chip, wherein an anode and a cathode of the micro inorganic light-emitting diode chip are connected to the bonding electrode on the display substrate.

The process of bonding and connecting the display substrate to the micro inorganic light-emitting diode chip includes: (1) transferring the micro inorganic light-emitting diode chip prepared on a wafer substrate through a transfer carrier board; (2) adsorbing a large number of micro inorganic light-emitting diode chips by the transfer carrier board from the wafer substrate; (3) adsorbing the micro inorganic light-emitting diode chips by the transfer carrier board to transfer the chips to the display substrate; and (4) aligning and pressing the micro inorganic light-emitting diode chips on the display substrate through an alignment and pressing device and process, and welding or bonding to solidify the anode and the cathode of the micro inorganic light-emitting diode chip respectively in press-fit with the corresponding bonding electrode of the driver circuit on the display substrate. That is, the micro inorganic light-emitting diode chip is transferred to the display substrate by a mass transfer method, and then bonded and connected. For example, the bonding pressure of the mass transfer is greater than 1 Mpa; a conductive adhesive is used in the bonding solidification of the anode and the cathode of the micro inorganic light-emitting diode chip with the corresponding bonding electrode on the driver circuit of the display substrate respectively at a temperature of 180° C. to 220° C. for more than 300 s.

The transfer carrier board may be a PDMS (polydimethylsiloxane) adsorption board or an electrostatic adsorption board. That is, the transfer is performed by adsorbing the micro inorganic light-emitting diode chip through a PDMS board or by electrostatic adsorption. The mass transfer process of LEDs is a relatively mature process, and thus is not described in detail here.

In some embodiments, there are a plurality of micro inorganic light-emitting diode chips arranged in an array; the micro inorganic light-emitting diode chips emit light of the same color; and the preparation method of a display panel further includes preparing a light conversion layer; wherein the light conversion layer is prepared on a side of the micro inorganic light-emitting diode chips facing away from the display substrate, and the light conversion layer is distributed corresponding to the micro inorganic light-emitting diode chip.

In some embodiments, the display substrate has a first sub-pixel region, a second sub-pixel region and a third sub-pixel region adjacent to and spaced from each other; the first sub-pixel region, the second sub-pixel region and the third sub-pixel region are respectively provided with one micro inorganic light-emitting diode chip; preparing the light conversion layer includes preparing a red quantum dot pattern, a green quantum dot pattern and a transparent adhesive film pattern; and the preparation method of a display panel further includes forming a red quantum dot pattern on a light-emitting side of the micro inorganic light-emitting diode chip in the first sub-pixel region; forming a green quantum dot pattern on a light-emitting side of the micro inorganic light-emitting diode chip in the second sub-pixel region; and forming a transparent adhesive film pattern on a light-emitting side of the micro inorganic light-emitting diode chip in the third sub-pixel region.

The red quantum dot pattern, the green quantum dot pattern and the transparent adhesive film pattern are prepared by a photolithography process or an inkjet printing process. The photolithography process includes the process steps of film layer coating, exposure and development.

In some embodiments, the preparation method of a display panel further includes forming an opaque pixel defining layer between the first, second and third sub-pixel regions. The pixel defining layer is prepared by a printing method. The pixel defining layer is prepared after the micro inorganic light-emitting diode chip and the display substrate are bonded and the quantum dot color filter is prepared, so that light crosstalk between adjacent micro inorganic light-emitting diode chips can be well prevented.

Finally, a film packaging process is carried out by a printing or photolithography method to complete preparation of the display panel.

In the display panel provided in the above embodiment, by adopting the display substrate in the above embodiments, the difficulty in preparing the display panel is reduced, while the efficiency in preparing the display panel is improved.

The display panel provided in the embodiments of the disclosure may be any product or part with a display function, such as a micro inorganic light-emitting diode panel, a micro inorganic light-emitting diode television, a Mini-LED panel, a Mini-LED television, a display, a mobile phone, a navigator and the like.

It will be appreciated that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclo-

What is claimed is:

1. A display substrate, comprising a substrate, and a driver circuit, an insulation layer and a bonding electrode sequentially superposed on the substrate, wherein the bonding electrode is configured to be connected to an anode and a cathode of a micro inorganic light-emitting diode chip to be bonded, and the display substrate further comprising an elastic layer sandwiched between the bonding electrode and the insulation layer, the elastic layer having an orthographic projection on the substrate covering at least an orthographic projection of the bonding electrode on the substrate, wherein the elastic layer has a minimum film thickness of: [(pressure/stress)]/elastic modulus*[(X1/L1−X2/L2)L1];

where the pressure refers to a pressure at which a transfer carrier board carrying the micro inorganic light-emitting diode chip to be bonded is bonded and pressed on the display substrate; the stress refers to an internal stress of the display substrate; the elastic modulus refers to an elastic modulus of the elastic layer; X1 is a distance between a position point of maximum warping of the transfer carrier board carrying the micro inorganic light-emitting diode chip to be bonded and the position point when no warping occurs; L1 is a width of the transfer carrier board carrying the micro inorganic light-emitting diode chip to be bonded that is perpendicular to a warping direction thereof; X2 is a distance between a position point of maximum warping of the display substrate and the position point when no warping occurs; and L2 is a width of the display substrate that is perpendicular to a warping direction thereof, wherein a material of the elastic layer comprises a conductive photoresist, wherein the bonding electrode comprises a first electrode and a second electrode spaced apart from each other, the elastic layer comprises a first subsection and a second subsection spaced apart from each other, an orthographic projection of the first subsection on the substrate covers an orthographic projection of the first electrode on the substrate, and an orthographic projection of the second subsection on the substrate covers an orthographic projection of the second electrode on the substrate, and the insulation layer is opened with a first via and a second via, the first subsection extends through the first via to be connected to a first end of the driver circuit; and the second subsection extends through the second via to be connected to a second end of the driver circuit.

2. The display substrate according to claim 1, wherein a material of the first electrode comprises any one or more of titanium, nickel, copper and gold; and a material of the second electrode comprises any one or more of titanium, nickel, copper and gold.

3. A display panel, comprising the display substrate according to claim 1, and further comprising a micro inorganic light-emitting diode chip having an anode and a cathode thereof connected to the bonding electrode on the display substrate.

4. The display panel according to claim 3, wherein there are a plurality of micro inorganic light-emitting diode chips arranged in an array; the plurality of micro inorganic light-emitting diode chips emit light of the same color; and the display panel further comprises a light conversion layer provided on a side of the micro inorganic light-emitting diode chips facing away from the display substrate.

5. The display panel according to claim 4, wherein the display substrate has a first sub-pixel region, a second sub-pixel region and a third sub-pixel region sequentially arranged at intervals; the first sub-pixel region, the second sub-pixel region and the third sub-pixel region are respectively provided with one micro inorganic light-emitting diode chip;

the light conversion layer comprises a red quantum dot pattern, a green quantum dot pattern and a transparent adhesive film pattern;

the red quantum dot pattern is provided on a light-emitting side of the micro inorganic light-emitting diode chip in the first sub-pixel region, the green quantum dot pattern is provided on a light-emitting side of the micro inorganic light-emitting diode chip in the second sub-pixel region, and the transparent adhesive film pattern is provided on a light-emitting side of the micro inorganic light-emitting diode chip in the third sub-pixel region.

6. The display panel according to claim 5, wherein an opaque pixel defining layer is disposed between the first, second and third sub-pixel regions.

7. The display panel according to claim 6, wherein the insulation layer in the display substrate is opaque to light.

8. A preparation method of a display substrate, comprising sequentially preparing a driver circuit, an insulation layer and a bonding electrode on a substrate, wherein the bonding electrode is configured to be connected to an anode and a cathode of a micro inorganic light-emitting diode chip to be bonded, and the preparation method further comprising, after preparing the insulation layer and before the bonding electrode, preparing an elastic layer which has an orthographic projection on the substrate covering at least an orthographic projection of the bonding electrode on the substrate, wherein the elastic layer has a minimum film thickness of: [(pressure/stress)]/elastic modulus*[(X1/L1−X2/L2)L1];

where the pressure refers to a pressure at which a transfer carrier board carrying the micro inorganic light-emitting diode chip to be bonded is bonded and pressed on the display substrate; the stress refers to an internal stress of the display substrate; the elastic modulus refers to an elastic modulus of the elastic layer; X1 is a distance between a position point of maximum warping of the transfer carrier board carrying the micro inorganic light-emitting diode chip to be bonded and the position point when no warping occurs; L1 is a width of the transfer carrier board carrying the micro inorganic light-emitting diode chip to be bonded that is perpendicular to a warping direction thereof; X2 is a distance between a position point of maximum warping of the display substrate and the position point when no warping occurs; and L2 is a width of the display substrate that is perpendicular to a warping direction thereof, wherein a material of the elastic layer comprises a conductive photoresist, wherein the bonding electrode comprises a first electrode and a second electrode spaced apart from each other, the elastic layer comprises a first subsection and a second subsection spaced apart from each other, an orthographic projection of the first subsection on the substrate covers an orthographic projection of the first electrode on the substrate, and an orthographic projection of the second subsection on the substrate covers an orthographic projection of the second electrode on the substrate, and the insulation layer is opened with a first via and a second via, the first subsection extends through the first via to be connected to a first end of the driver circuit; and the second subsection extends through the second via to be connected to a second end of the driver circuit.

9. The preparation method of a display substrate according to claim 8, wherein preparing the elastic layer comprises:

calculating a minimum film thickness of the elastic layer, and determining a minimum process film thickness of the elastic layer according to the minimum film thickness;

coating to form an elastic layer film with the minimum process film thickness;

exposing and developing to form a pattern of the elastic layer; and drying and curing the elastic layer.

10. A preparation method of a display panel, comprising bonding and connecting the display substrate prepared according to claim 8 to a micro inorganic light-emitting diode chip, wherein an anode and a cathode of the micro inorganic light-emitting diode chip are connected to the bonding electrode on the display substrate.

11. The preparation method of a display panel according to claim 10, wherein there are a plurality of micro inorganic light-emitting diode chips arranged in an array; the micro inorganic light-emitting diode chips emit light of the same color; and the preparation method of a display panel further comprises preparing a light conversion layer;

wherein the light conversion layer is prepared on a side of the micro inorganic light-emitting diode chips facing away from the display substrate, and the light conversion layer is distributed corresponding to the micro inorganic light-emitting diode chip.

12. The preparation method of a display panel according to claim 11, wherein the display substrate has a first sub-pixel region, a second sub-pixel region and a third sub-pixel region adjacent to and spaced from each other; the first sub-pixel region, the second sub-pixel region and the third sub-pixel region are respectively provided with one micro inorganic light-emitting diode chip;

preparing the light conversion layer comprises preparing a red quantum dot pattern, a green quantum dot pattern and a transparent adhesive film pattern; and the preparation method further comprises forming a red quantum dot pattern on a light-emitting side of the micro inorganic light-emitting diode chip in the first sub-pixel region; forming a green quantum dot pattern on a light-emitting side of the micro inorganic light-emitting diode chip in the second sub-pixel region; and forming a transparent adhesive film pattern on a light-emitting side of the micro inorganic light-emitting diode chip in the third sub-pixel region.

13. The preparation method of a display panel according to claim 12, further comprising forming an opaque pixel defining layer between the first, second and third sub-pixel regions.

* * * * *